(12) United States Patent
Sasao

(10) Patent No.: US 6,546,030 B2
(45) Date of Patent: Apr. 8, 2003

(54) SEMICONDUCTOR LASER UNIT EMPLOYING AN INORGANIC ADHESIVE

(75) Inventor: Masanori Sasao, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/892,510

(22) Filed: Jun. 28, 2001

(65) Prior Publication Data

US 2002/0001323 A1 Jan. 3, 2002

(30) Foreign Application Priority Data

Jun. 29, 2000 (JP) ........................................ 2000-195839

(51) Int. Cl.[7] ................................................ H01S 5/22
(52) U.S. Cl. ............................................. 372/36; 372/34
(58) Field of Search ...................................... 372/34, 36

(56) References Cited

U.S. PATENT DOCUMENTS 5,875,204 A * 2/1999 Sato ............................. 372/34

* cited by examiner

Primary Examiner—James Davie
(74) Attorney, Agent, or Firm—Sughrue Mion, PLLC

(57) ABSTRACT

Disclosed herein is a semiconductor laser unit equipped with a semiconductor laser chip mounted within a package, a temperature sensing component fixed within the package, and an optical component fixed within the package. At least either the fixation of the temperature sensing component or the fixation of the optical component is performed with an inorganic adhesive.

8 Claims, 5 Drawing Sheets

SEMICONDUCTOR LASER UNIT EMPLOYING AN INORGANIC ADHESIVE

BACKGROUND OF THE INVENTION

1. Field of the Invention

The present invention relates to a semiconductor laser unit, and more particularly to a semiconductor laser unit having a semiconductor element, optical components, temperature sensing components, etc., within a package.

2. Description of the Related Art

In conventional high-output semiconductor laser units, an organic adhesive such as epoxy, silicon, etc., is used for fixing a temperature sensing component such as a Peltier element, a thermistor, etc., and an optical component such as a lens, an optical fiber, etc., within a package. Furthermore, a method of sealing the package hermetically with dried air or inert gas is adapted with the object of preventing condensation within the package or preventing the entrance of dust into the package. In a conventional semiconductor laser unit shown in FIG. 6, for example, solder 16 is used in joining a laser stem 14, bonding a semiconductor laser 15, and a heat spreader 13 together to assure conductivity and heat radiation. The join between other temperature sensing components that require no conductivity, that is, the join between the heat spreader 13 and Peltier elements 12, or the join between a thermistor 19 and the laser stem 14, is performed by use of an organic adhesive 24 such as epoxy, silicon, etc.

However, the organic adhesive used for fixation of the aforementioned components generates organic gases gradually from the interior of the adhesive because of heat generation during laser operation, elapse of time, etc. Since the semiconductor laser unit is in a hermetically sealed state, the generated organic gases adhere to the lens or windowpane and change their transmission factors.

SUMMARY OF THE INVENTION

The present invention has been made in view of the aforementioned circumstances. Accordingly, it is the primary object of the present invention to provide a semiconductor laser unit which is capable of preventing a change in the transmission factor of an optical component and a reduction in the optical output due to the adhesion of a residual organic substance, etc., to the optical component, and obtaining an optical output whose reliability is high up to high output.

To achieve this end, there is provided a semiconductor laser unit comprising: a semiconductor laser chip mounted within a package; a temperature sensing component fixed within the package; and an optical component fixed within the package; wherein at least either the fixation of the temperature sensing component or the fixation of the optical component is performed with an inorganic adhesive.

In the semiconductor laser unit, the package may be hermetically sealed. It is desirable that the inorganic adhesive have at least one of alumina, zirconia, or silica as its main component. It is also desirable that the inorganic adhesive have an inorganic metal material as its main component. In that case it is desirable that the inorganic metal material be soldering material.

The aforementioned "temperature sensing component" is a component for sensing heat generated from a semiconductor chip or an optical component and then keeping the temperature of the semiconductor chip constant. The temperature sensing component has function such as cooling, heat radiation, heating, etc., or has a combined function of them and is fixed within the package along with the optical component.

The aforementioned "optical component" refers to any optical component, which is used for light transmission, focusing, polarization, deflection, modulation, wavelength selection, wavelength conversion, etc., such as a lens, an optical filter, etc. The optical component used in the present invention includes a windowpane provided in a package cover.

The aforementioned "inorganic adhesive" is an adhesive composed mainly of an inorganic substance. More specifically, it contains an inorganic substance of 99% or greater and an organic substance of 1% or less.

The aforementioned "main component" indicates a component whose content is largest. In the case where there are a plurality of components whose content is almost largest, the main component indicates the plurality of components.

According to the present invention, at least either a temperature sensing component or an optical component is fixed with an inorganic adhesive. For this reason, organic gases are hardly generated. Therefore, the present invention is capable of preventing a change in the transmission factor of the optical component, a reduction in optical output, and occurrence of optical noise due to the adhesion of organic gases to the optical component, and obtaining an optical output whose reliability is high up to high output. The present invention is also capable of enhancing optical output more effectively if it is applied to a semiconductor laser unit where a package is hermetically sealed.

BRIEF DESCRIPTION OF THE DRAWINGS

The present invention will be described in further detail with reference to the accompanying drawings wherein.

DESCRIPTION OF THE PREFERRED EMBODIMENTS

Embodiments of the present invention will hereinafter be described in detail with reference to the drawings.

Figure 1:
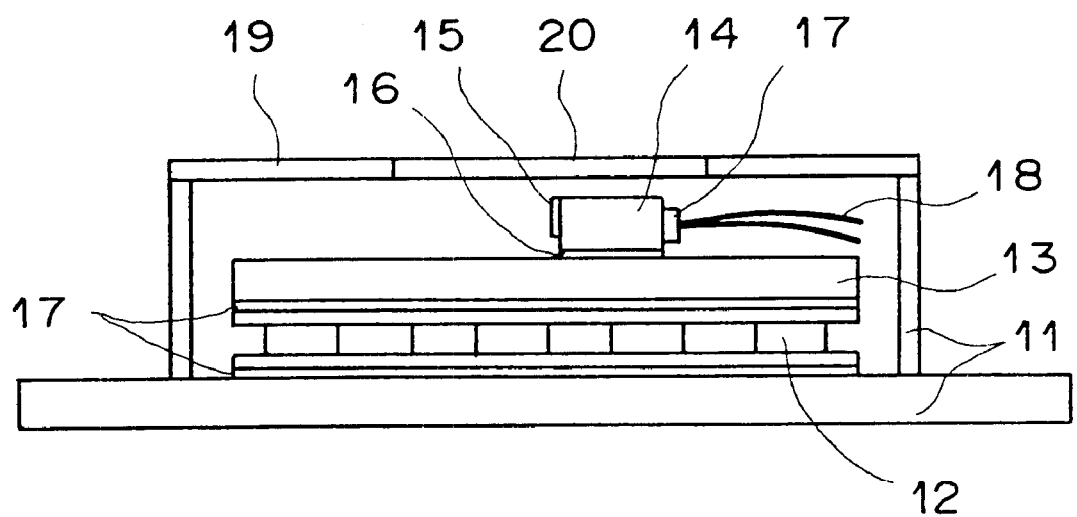
FIG. 1 is a sectional view showing a semiconductor laser unit constructed according to a first embodiment of the present invention.

As illustrated in FIG. 1, a semiconductor laser unit in a first embodiment of the present invention includes Peltier elements 12 stuck within a package 11 with an inorganic adhesive 17, a heat spreader 13 stuck on the Peltier elements 12 with the inorganic adhesive 17, and a laser stem 14 stuck on the heat spreader 13 with solder 16. The laser stem 14 has a semiconductor bonded thereon with soldering material such as Au-Sn, In, etc. The laser stem 14 further has a thermistor 18 stuck by the inorganic adhesive 17. This package 11 is provided with a cover 19 having a windowpane 20 and is sealed hermetically by seam welding, etc. The windowpane 20 is fixed with low-melting-point glass composed of lead-borosilicate glass.

The inorganic adhesive 17 contains an inorganic substance of 99% or greater and an organic substance of 1% or less. For example, there is sodium silicate (water glass). To enhance adhesive strength, an organic polymer can be added as a binder to ceramic which is aggregate. Some examples are a Toagosei-made inorganic adhesive having silica as its main component, "Alone Ceramic C," a Toagosei-made inorganic adhesive having alumina as its main component, "Alone Ceramic D," a Toagosei-made inorganic adhesive having zirconia and silica as its main components, "Alone Ceramic E," a 3Bond-made inorganic adhesive having alumina as its main component, "3711," a 3Bond-made inorganic adhesive having zirconia and silica as its main components, "3715," etc. The hardening condition, for the Toagosei-made inorganic adhesives "Alone Ceramic C," "Alone Ceramic D," and "Alone Ceramic E," is about 1 hr at 150° C. The hardening condition for the 3Bond-made inorganic adhesives "3711" and "3715" is 30 min at 150° C.

As the inorganic adhesive 17 that is employed in the semiconductor laser unit of the first embodiment, it is desirable to select an adhesive, whose linear expansion coefficient is closer to those of the package 11, Peltier element 12 and heat spreader 13, among the aforementioned inorganic adhesives, in order to suppress strain, which is produced by heat during laser operation or Peltier operation, after hardening.

In the semiconductor laser unit of the first embodiment, an inorganic adhesive is used for fixing the laser stem 14, Peltier elements 12, heat spreader 13, and thermistor 18. For this reason, the semiconductor laser unit of the first embodiment can suppress the occurrence of organic gases from the adhesive. Therefore, the semiconductor laser unit is capable of preventing a change in the transmission factor of the windowpane 20 being an optical component within the package, a reduction in the optical output, and occurrence of optical noise due to the adhesion of organic gases to the windowpane 20. As a result, the semiconductor laser unit of the first embodiment is capable of obtaining an optical output whose reliability is high up to high output.

Figure 2:
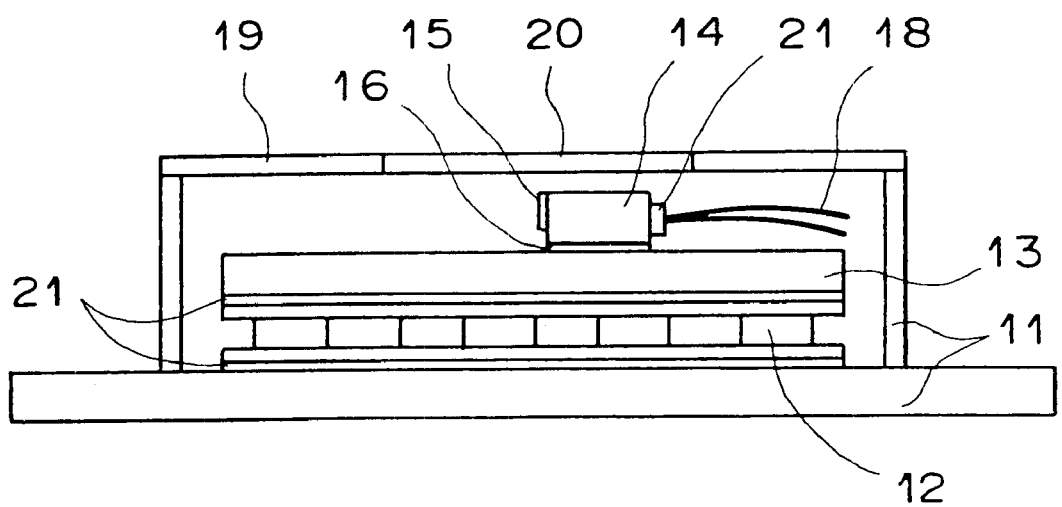
FIG. 2 is a sectional view showing a semiconductor laser unit constructed according to a second embodiment of the present invention.

FIG. 2 illustrates a semiconductor laser unit according to a second embodiment of the present invention. The semiconductor laser unit in the second embodiment uses an inorganic metal material 21 to fix Peltier elements 12, a heat spreader 13, and a thermistor 18 which are temperature sensing components. The same reference numerals denote the same parts as the first embodiment and therefore a description thereof is omitted to avoid redundancy. As illustrated in FIG. 2, the semiconductor laser unit of the second embodiment includes the Peltier elements 12 stuck within a package 11 with the inorganic metal material 21, the heat spreader 13 stuck on the Peltier elements 12 with the inorganic metal material 21, and a laser stem 14 stuck on the heat spreader 13 with solder 16. The laser stem 14 has the thermistor 18 stuck with the inorganic metal material 21. Furthermore, a windowpane 20 is fixed with low-melting-point glass composed of lead-borosilicate glass.

Some examples of the inorganic metal material 21 are Sn—Pb, Sn—In, Sn—Pb—In, etc. It is preferable to select an inorganic metal material, which has operability and heat radiation, among these materials. Note that the inorganic metal material 21 is joined at the melting point of the inorganic metal material 21 plus 10° C. or greater. Since it is excellent in heat transfer, the inorganic metal material 21 is capable of enhancing heat radiation considerably, compared with the first embodiment employing an inorganic adhesive.

The second embodiment, as with the first embodiment, uses an inorganic adhesive to fix temperature sensing components and is therefore capable of suppressing the occurrence of organic gases from the adhesive. As a result, the second embodiment is capable of preventing organic gases from adhering to the windowpane 20 being an optical component within the package, and preventing a reduction in the optical output and a change in the transmission factor of the windowpane 20 due to the gas adhesion.

Figure 3:
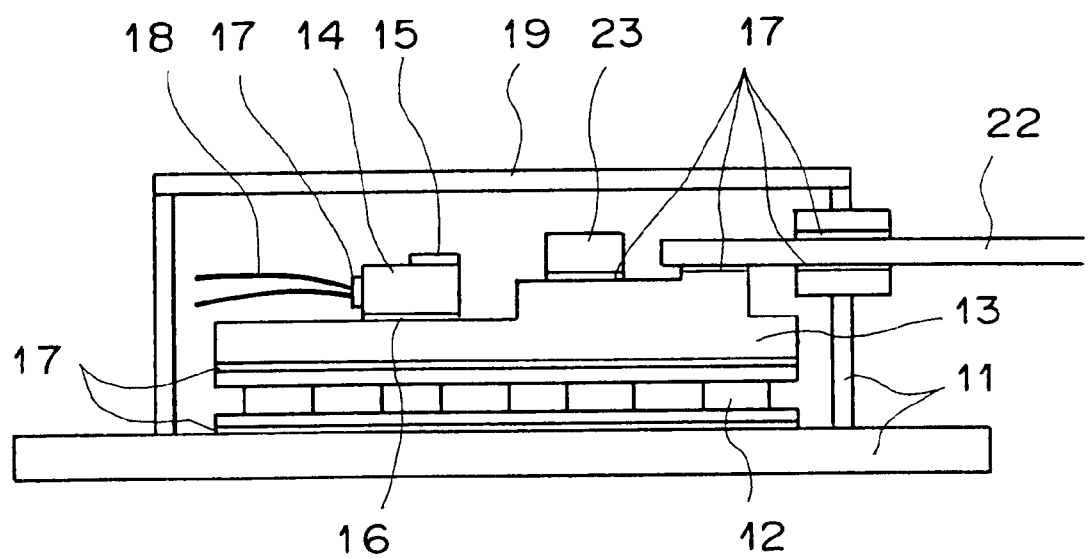
FIG. 3 is a sectional view showing a semiconductor laser unit constructed according to a third embodiment of the present invention.

FIG. 3 illustrates an optical fiber coupling type semiconductor laser unit according to a third embodiment of the present invention. The semiconductor laser unit in the third embodiment uses an inorganic adhesive to fix a laser stem 14, Peltier elements 12, a heat spreader 13, and a thermistor 18 which are temperature sensing components and to fix a lens 23 and a fiber 22 which are optical components. As illustrated in FIG. 3, the semiconductor laser unit of the third embodiment includes the Peltier elements 12 stuck within a package 11 with the inorganic adhesive 17, the heat spreader 13 stuck on the Peltier elements 12 with the inorganic adhesive 17, and the laser stem 14 stuck on the heat spreader 13 with solder 16. The laser stem 14 has a laser chip 15 bonded thereon with soldering material such as Au—Sn, In, etc. The laser stem 14 further has the thermistor 18 stuck with the inorganic adhesive 17. Furthermore, the heat spreader 13 has the lens 23 and the fiber 22 mounted thereon using the inorganic adhesive 17.

Some examples of the inorganic adhesive 17, as previously described, are Toagosei-made inorganic adhesives "Alone Ceramic C," "Alone Ceramic D," and "Alone Ceramic E," 3Bond-made inorganic adhesives "3711" and "3715," etc. The hardening conditions for these, as previously described, are 1 hr at 150° C. for Alone Ceramics and 30 min at 150° C. for the 3Bond-made inorganic adhesives.

The semiconductor laser unit of the third embodiment uses the inorganic adhesive to fix the Peltier elements 12, heat spreader 13, laser stem 14, thermistor 18 being temperature sensing components and also fix the lens 23 and fiber 22 being optical components. For this reason, the semiconductor laser unit of the third embodiment is capable of preventing a change in the transmission factors of the optical components and a change in the optical output due to organic gases and thus obtaining an optical output whose reliability is high up to high output.

Figure 6:
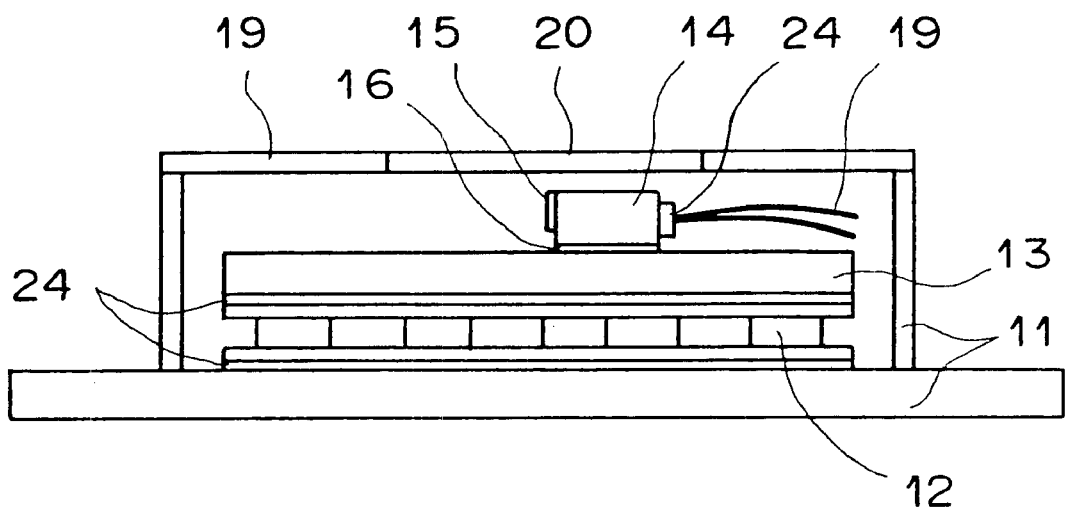
FIG. 6 is a sectional view showing a conventional semiconductor laser unit employing an organic adhesive.

Now, a description will be given of the characteristics of a conventional semiconductor laser unit and the semiconductor laser unit of the present invention. The same reference numerals denote the same parts as the first embodiment and therefore a description thereof is omitted to avoid redundancy. As illustrated in FIG. 6, the join between a laser stem 14, bonding a semiconductor laser chip 15, and a heat spreader 13 is performed with solder to assure conductivity and heat radiation. The join of temperature sensing components requiring no conductivity, that is, the join between the heat spreader 13 and Peltier elements 12 and the join between a thermistor 19 and the laser stem 14 are performed with epoxy, silicon, polyester, urethane, phenol, acrylic, chloroprene, or an organic adhesive 24 such as polyimide, etc., for example, a Toray-Dow-Corning-Silicon-made silicon adhesive "DA6501," an Epoxy-Technology-made epoxy adhesive "353ND," a Toshiba-Silicon-made silicon adhesive "TSE385," etc. Furthermore, after fixation of components, a cover 19 and a package 11 are sealed hermetically with dried air or inert gas by seam welding in order to prevent condensation and the entry of dust.

Figure 4:
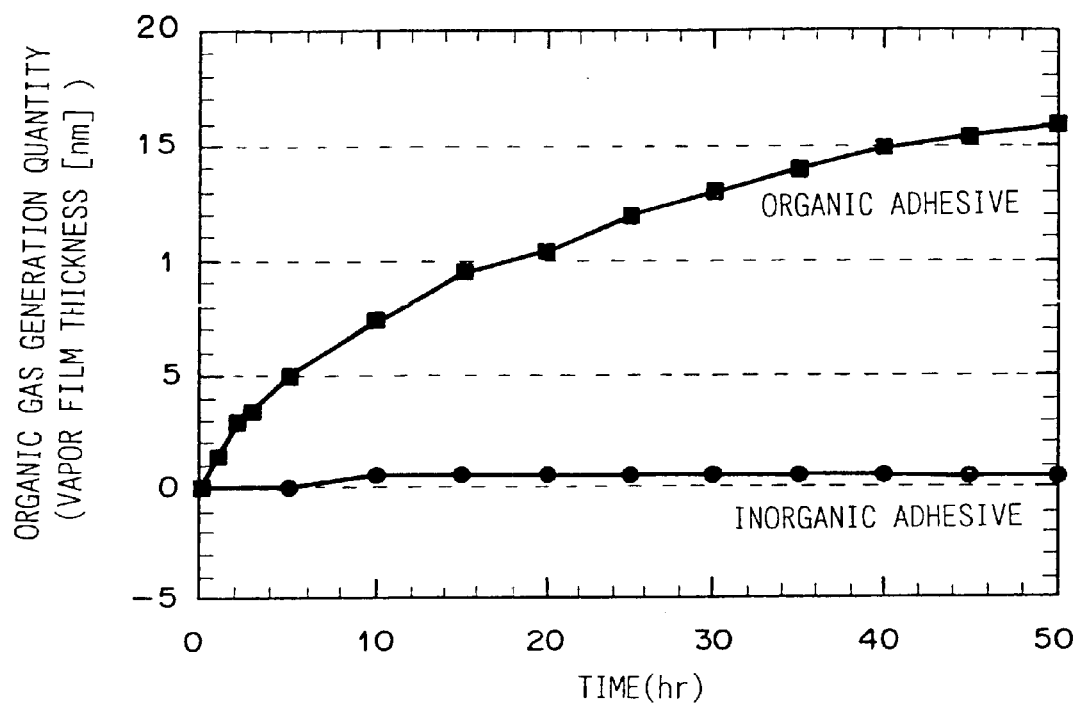
FIG. 4 is a graph showing the quantities of organic gases generated from an organic adhesive and an inorganic adhesive by heating under vacuum.

Next, the quantity of organic gases generated from an inorganic adhesive is compared with the quantity of organic gases generated from an organic adhesive. The comparison is shown in FIG. 4. The gas generation quantities were measured with the following method. A heater was provided within a vacuum chamber. A fixed quantity of adhesive was placed on the heater, and a quartz oscillator was disposed above the heater. The vapor film thickness of organic gases that adhered to the quartz oscillator was measured. The heating temperature was 80° C., and the degree of vacuum with the vacuum chamber was set to about $6.65 \times 10^{-4}$ Pa. The inorganic adhesive employed the "Alone Ceramic D". It was heated within an oven or on a hot plate at 150° C. for about 1 hr and was hardened. The organic adhesive employed the Toray-Dow-Corning-Silicon-made silicon adhesive "DA6501."

As shown in FIG. 4, it is found that in the case of the organic adhesive, the generation quantity of the organic gases has increased with time and adhered to a thickness of about 16 mm (per diameter 5 mm) in 50 hr. In the case of the inorganic adhesive, the gas generation quantity has stayed at a thickness of 1 nm or less for 50 hr.

Figure 5:
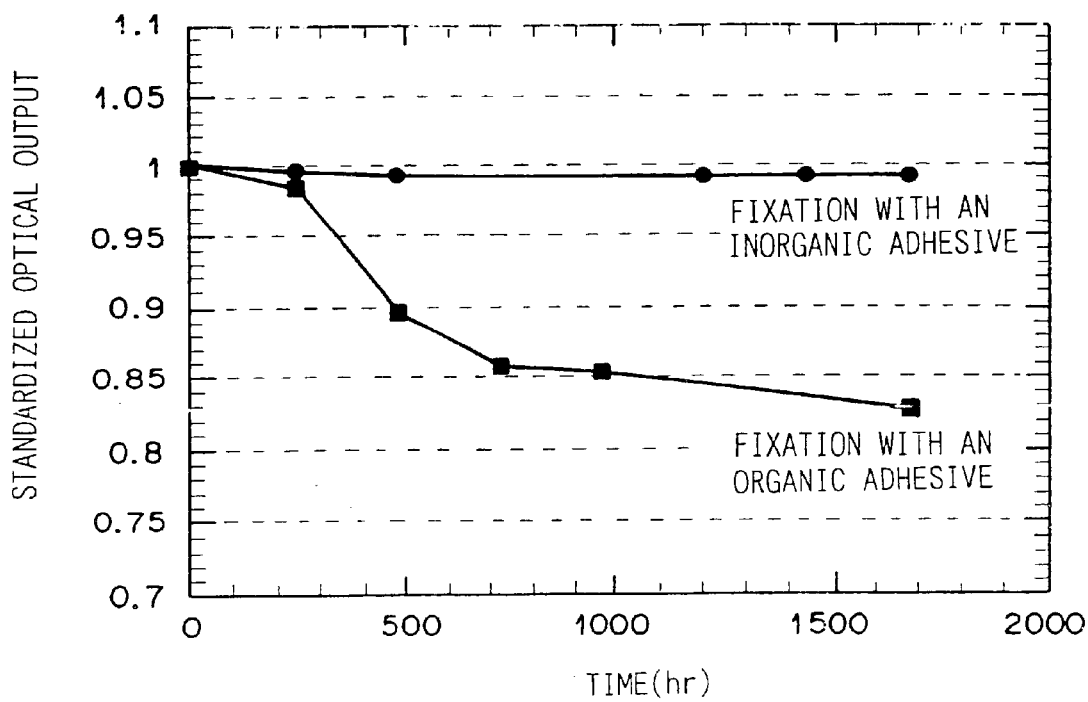
FIG. 5 is a graph showing a change in optical output with elapse of time in the case where the semiconductor laser unit of the first embodiment employs an inorganic adhesive and the case where it employs an organic adhesive.

Next, changes in the optical output of the semiconductor laser unit of the first embodiment were measured in the case where the "Alone Ceramic D" was employed as the inorganic adhesive 17 and the case where the Toray-Dow-Corning-Silicon-made silicon adhesive "DA6501" was employed as an organic adhesive instead of the inorganic adhesive 17. The results of measurement are shown in FIG. 5. As shown in the figure, in the case of the organic adhesive, the optical output is reduced to about 83% of the initial optical output after an operation of 1700 hr. However, in the case of the inorganic adhesive, the optical output stays at a reduction of about 1% after an operation of 1700 hr, compared with the initial optical output. From this fact it follows that in the case of employing the organic adhesive, organic gases are generated with elapse of time and reduce the optical output of the semiconductor laser unit.

While the present invention has been described with reference to the preferred embodiments thereof, the invention is not to be limited to the details given herein, but may be modified within the scope of the invention hereinafter claimed.

What is claimed is:

1. A semiconductor laser unit comprising:
    a semiconductor laser chip mounted within a package;
    a temperature sensing component fixed within said package; and
    an optical component fixed within said package;
    wherein at least either the fixation of said temperature sensing component or the fixation of said optical component is performed with an inorganic adhesive,
    wherein said inorganic adhesive has at least one of alumina, zirconia, or silica as its main component.

2. The semiconductor laser unit as set forth in claim 1, wherein said package is hermetically sealed.

3. The semiconductor laser unit as set forth in claim 1, wherein said inorganic adhesive contains an organic substance of 1% or less.

4. The semiconductor laser unit as set forth in claim 2, wherein said inorganic adhesive contains an organic substance of 1% or less.

5. The semiconductor laser unit as set forth in claim 1, wherein one of the fixation of the temperature sensing component or the fixation of the optical component is performed with said inorganic adhesive that has at least one of alumina, zirconia or silica as its main component, and the other of the fixation of the temperature sensing component or the fixation of the optical component is performed with an inorganic adhesive that has an inorganic metal material as its main component.

6. The semiconductor laser unit as set forth in claim 2, wherein one of the fixation of the temperature sensing component or the fixation of the optical component is performed with said inorganic adhesive that has at least one of alumina, zirconia or silica as its main component, and the other of the fixation of the temperature sensing component or the fixation of the optical component is performed with an inorganic adhesive that has an inorganic metal material as its main component.

7. The semiconductor laser unit as set forth in claim 3, wherein one of the fixation of the temperature sensing component or the fixation of the optical component is performed with said inorganic adhesive that has at least one of alumina, zirconia or silica as its main component, and the other of the fixation of the temperature sensing component or the fixation of the optical component is performed with an inorganic adhesive that has an inorganic metal material as its main component.

8. The semiconductor laser unit asset forth in claim 5, wherein said inorganic metal material is soldering material.

* * * * *